(12) United States Patent
Yu

(10) Patent No.: US 10,340,481 B2
(45) Date of Patent: Jul. 2, 2019

(54) MANUFACTURING METHOD OF OLED DISPLAY PANEL

(71) Applicant: WUHAN CHINA STAR OPTOELECTRONICS SEMICONDUCTOR DISPLAY TECHNOLOGY CO., LTD., Wuhan, Hubei (CN)

(72) Inventor: Wei Yu, Hubei (CN)

(73) Assignee: WUHAN CHINA STAR OPTOELECTRONICS SEMICONDUCTOR DISPLAY TECHNOLOGY CO., LTD., Wuhan, Hubei (CN)

( * ) Notice: Subject to any disclaimer, the term of this patent is extended or adjusted under 35 U.S.C. 154(b) by 44 days.

(21) Appl. No.: 15/577,123

(22) PCT Filed: Oct. 19, 2017

(86) PCT No.: PCT/CN2017/106803
§ 371 (c)(1),
(2) Date: Nov. 27, 2017

(87) PCT Pub. No.: WO2019/033538
PCT Pub. Date: Feb. 21, 2019

(65) Prior Publication Data
US 2019/0058166 A1 Feb. 21, 2019

(30) Foreign Application Priority Data
Aug. 17, 2017 (CN) .......................... 2017 1 0707422

(51) Int. Cl.
*H01L 21/44* (2006.01)
*H01L 51/56* (2006.01)
(Continued)

(52) U.S. Cl.
CPC ........ *H01L 51/56* (2013.01); *H01L 21/02345* (2013.01); *H01L 23/3121* (2013.01);
(Continued)

(58) Field of Classification Search
CPC . H01L 51/56; H01L 51/5246; H01L 27/3272; H01L 51/0001; H01L 51/0024;
(Continued)

(56) References Cited

U.S. PATENT DOCUMENTS 9,673,356 B2 * 6/2017 Gao ................. H01L 21/67126
2010/0186449 A1 * 7/2010 Aitken ................. C03B 23/245
65/34
(Continued)

FOREIGN PATENT DOCUMENTS

CN 103426903 A 12/2013
CN 104466031 A 3/2015
(Continued)

*Primary Examiner* — Shouxiang Hu
(74) *Attorney, Agent, or Firm* — Ladas & Parry LLP

(57) ABSTRACT

The present invention provides a manufacturing method of an OLED display panel, including frosting a portion of an inner surface of an encapsulation cover plate corresponding to both sides of a glass frit to-be-disposed region; disposing a light shielding film at the frosted treatment region of the inner surface of the encapsulation cover plate, wherein the light shielding film is a metal film having a light transmittance less than a first predetermined value or a non-metal film having a light transmittance less than a second predetermined value; and disposing a glass frit on the glass frit to-be-disposed region.

18 Claims, 2 Drawing Sheets

(51) Int. Cl.
  *H01L 27/32* (2006.01)
  *H01L 51/52* (2006.01)
  *H01L 51/00* (2006.01)
  *H01L 21/02* (2006.01)
  *H01L 23/31* (2006.01)

(52) U.S. Cl.
  CPC ...... *H01L 27/3272* (2013.01); *H01L 51/0001* (2013.01); *H01L 51/0024* (2013.01); *H01L 51/524* (2013.01); *H01L 51/5246* (2013.01)

(58) Field of Classification Search
  CPC ............. H01L 51/524; H01L 21/02345; H01L 23/3121
  See application file for complete search history.

(56) References Cited

U.S. PATENT DOCUMENTS

| | | | |
|---|---|---|---|
| 2012/0099061 A1 | 4/2012 | Lee | |
| 2014/0210991 A1* | 7/2014 | Koo | H01L 51/5246 348/86 |
| 2015/0223296 A1* | 8/2015 | Chen | H01L 51/5246 313/512 |
| 2016/0372521 A1 | 12/2016 | Gao | |
| 2016/0372529 A1* | 12/2016 | Wu | H01L 51/56 |
| 2017/0183767 A1* | 6/2017 | Hong | H01L 51/56 |

FOREIGN PATENT DOCUMENTS

| | | |
|---|---|---|
| CN | 104576707 A | 4/2015 |
| CN | 104846331 A | 8/2015 |

\* cited by examiner

MANUFACTURING METHOD OF OLED DISPLAY PANEL

CROSS REFERENCE TO RELATED APPLICATIONS

This application is a U.S. National Phase application submitted under 35 U.S.C. § 371 of Patent Cooperation Treaty Application serial No. PCT/CN2017/106803, filed on Oct. 19, 2017, which claims the priority of China Patent Application serial No. 201710707422.6, filed on Aug. 17, 2017, the disclosures of which are incorporated herein by reference in their entirety.

FIELD OF INVENTION

The present invention relates to the field of display technology, and more particular to a manufacturing method of an OLED display panel.

BACKGROUND OF INVENTION

Organic light-emitting diode (OLED) displays are a new generation of displays. An organic thin film is formed on an OLED substrate, the organic thin film is sandwiched between a cathode and an anode metal or conductive layer, the cathode and anode electrode are applied a voltage, and thus the organic film irradiates light. Compared with liquid crystal displays, OLED displays have advantages such as being self-luminous, having fast response times, wide viewing angles, saturated colors, and many other advantages.

Oxygen and moisture in the air cause active metal of the cathode of OLED devices to be oxidized, and cause chemical reactions with organic materials, resulting in OLED devices malfunctioning. Therefore, effective encapsulation of OLED devices makes the OLED devices fully isolated from moisture and oxygen, thus being critical for extending life of OLED devices.

Currently, major methods of OLED encapsulation are desiccant piece and UV glue, face seal, frit (glass frit) encapsulation, and thin-film encapsulation. Because frit encapsulation has a good effective encapsulation, and the encapsulating methods are flexible and convenient, the method can be flexibly used in different sizes of products. Therefore, frit encapsulation is a very developed encapsulating method.

As shown in FIG. 3, in order to ensure that a frit 302 is completely cured, irradiation width of the laser beam 303 needs to be wider than width of the frit 302, while a portion of laser beam wider than the frit 302 may irradiate through a encapsulation cover plate and to an electrode 301 of an OLED substrate, it is easy to make the electrode 301 on the substrate to fuse, thus the electrode 301 may short so as to make the OLED devices malfunction.

In order to avoid this situation, conventional art adds a mask unit in a machine, and after an alignment system processing, an opaque region of the mask blocks excess light of the laser beam, thereby the laser only irradiates on the frit, thus protecting the electrodes on the OLED substrate. However, this kind of method also has problems. First, the machine needs a precise alignment system support, the apparatus is expensive, and also prone to mal-position. Second, the laser shielded by the opaque region of the mask may reflect to the laser head, resulting in burn damage to the laser head.

In view of the above, the manufacturing methods of OLED display panels in the conventional art, in order to ensure the glass frit is completely cured, the irradiation width of the laser beam needs to be wider than a width of the glass frit, while a portion of laser beam wider than the frit may irradiate through a encapsulation cover plate and to an electrode of an OLED substrate, it is easy to make the electrode on the substrate to fuse, so as to make the OLED devices malfunction.

SUMMARY OF INVENTION

The present invention provides a manufacturing method of an OLED display panel, the method can block an excess light of the laser beam during the glass frit encapsulating process, thereby the laser only irradiates on the glass frit, thus protecting electrodes on an OLED substrate, thereby preventing the laser head to damage, and ensuring the effectiveness of the encapsulation.

In order to solve the above-mentioned problems, the technical solutions provided by the present invention are as follows:

The present invention provides a manufacturing method of an organic light-emitting diode (OLED) display panel, comprising:

a step S1 of frosting a portion of an inner surface of an encapsulation cover plate corresponding to both sides of a glass frit to-be-disposed region, wherein a frosted treatment region includes a frame-shaped first frosted region located inside the glass frit to-be-disposed region and a frame-shaped second frosted region located outside the glass frit to-be-disposed region, and each of the first frosted region and the second frosted region are closely adjacent to the glass frit to-be-disposed region through a slit, respectively;

a step S2 of disposing a light shielding film at the frosted treatment region of the inner surface of the encapsulation cover plate, wherein the light shielding film is a metal film having a light transmittance less than a first predetermined value or a non-metal film having a light transmittance less than a second predetermined value; and a step S3 of disposing a glass frit on the glass frit to-be-disposed region, thereby forming a frame-shape sealant.

According to a preferred embodiment of the present invention, a first width of the first frosted region is equal to a second width of the second frosted region, and a third width of the slit disposed between the first frosted region and the glass frit to-be-disposed region is equal to a fourth width of the slit disposed between the second frosted region and the glass frit to-be-disposed region.

According to a preferred embodiment of the present invention, the light shielding film further comprises a first light shielding film disposed on the first frosted region and a second light shielding film disposed on the second frosted region, and wherein the OLED display panel further comprises an electrode of an OLED device covered by the glass frit.

According to a preferred embodiment of the present invention further comprising steps of:

after disposing the glass frit, curing the glass frit at a high temperature; and generating a laser beam with a laser head to irradiate and cure the glass frit, wherein a temperature of curing the glass frit through the laser beam is greater than 500° C.

According to a preferred embodiment of the present invention, a region irradiated by the laser beam includes the first frosted region, the second frosted region, and a region covered by the glass frit.

According to a preferred embodiment of the present invention further comprising a step of:

applying a UV glue around the glass frit disposed on the encapsulation cover plate under a nitrogen environment.

According to a preferred embodiment of the present invention further comprising a step of:

aligning and attaching the encapsulation cover plate with an OLED substrate, and irradiating the UV glue by a UV light under a nitrogen environment, thereby curing the UV glue.

According to a preferred embodiment of the present invention further comprising steps of:

scanning the glass frit with a laser head at a side of the encapsulation cover plate under an atmospheric environment; melting the glass frit by a high temperature generated by the laser beam of the laser head; and then cooling and solidifying the glass frit, so that the encapsulation cover plate is attached on the OLED substrate.

According to a preferred embodiment of the present invention further comprising a step of:

cutting along a cutting line on a periphery of the glass frit, and discarding an offcut with the UV glue, thereby obtaining a glass frit sealed OLED display panel.

The present invention further provides a manufacturing method of an organic light-emitting diode (OLED) display panel, comprising:

a step S1 of frosting a portion of an inner surface of an encapsulation cover plate corresponding to both sides of a glass frit to-be-disposed region;

a step S2 of disposing a light shielding film at a frosted treatment region of the inner surface of the encapsulation cover plate, wherein the light shielding film is a metal film having a light transmittance less than a first predetermined value or a non-metal film having a light transmittance less than a second predetermined value; and a step S3 of disposing a glass frit on the glass frit to-be-disposed region, thereby forming a frame-shape sealant.

According to a preferred embodiment of the present invention, a first width of a first frosted region is equal to a second width of a second frosted region and a third width of the slit disposed between the first frosted region and the glass frit to-be-disposed region is equal to a fourth width of the slit disposed between the second frosted region and the glass frit to-be-disposed region.

According to a preferred embodiment of the present invention, the light shielding film further comprises a first light shielding film disposed on the first frosted region and a second light shielding film disposed on the second frosted region, and wherein the OLED display panel further comprises an electrode of an OLED device covered by the glass frit.

According to a preferred embodiment of the present invention further comprising steps of:

after disposing the glass frit, curing the glass frit at a high temperature; and generating a laser beam with a laser head to irradiate and cure the glass frit, wherein a temperature of curing the glass frit through the laser beam is greater than 500° C.

According to a preferred embodiment of the present invention, a region irradiated by the laser beam includes a first frosted region, a second frosted region and a region covered by the glass frit.

According to a preferred embodiment of the present invention further comprising a step of:

applying a UV glue around the glass frit disposed on the encapsulation cover plate under a nitrogen environment.

According to a preferred embodiment of the present invention further comprising a step of:

aligning and attaching the encapsulation cover plate with an OLED substrate, and irradiating the UV glue by a UV light under a nitrogen environment, thereby curing the UV glue.

According to a preferred embodiment of the present invention further comprising steps of:

scanning the glass frit with a laser head at a side of the encapsulation cover plate under an atmospheric environment; melting the glass frit by a high temperature generated by the laser beam of the laser head; and then cooling and solidifying the glass frit, so that the encapsulation cover plate is attached on the OLED substrate.

According to a preferred embodiment of the present invention further comprising a step of:

cutting along a cutting line on a periphery of the glass frit, and discarding an offcut with the UV glue, thereby obtaining a glass frit sealed OLED display panel.

The present invention has the following advantages: in comparison with the conventional manufacturing method of an OLED display panel, the present invention provides a manufacturing method of an OLED display panel, an excess light of the laser beam can be blocked during the glass frit encapsulating process, thereby the laser only irradiates on the glass frit, thus protecting electrodes on a OLED substrate. Moreover, the shielding region has been finished by a frosting treatment, the shielded laser is not reflected to the apparatus, such as a laser head, thereby preventing laser head damage, and ensuring the effectiveness of the encapsulation.

DESCRIPTION OF DRAWINGS

In order to more clearly illustrate the technical solutions in the embodiments or the prior art, the following drawings, which are intended to be used in the description of the embodiments or the prior art, will be briefly described. It will be apparent that the drawings and the following description are only some embodiments of the present invention. Those of ordinary skill in the art may, without creative efforts, derive other drawings from these drawings.

DETAILED DESCRIPTION OF PREFERRED EMBODIMENTS

Figure 1:
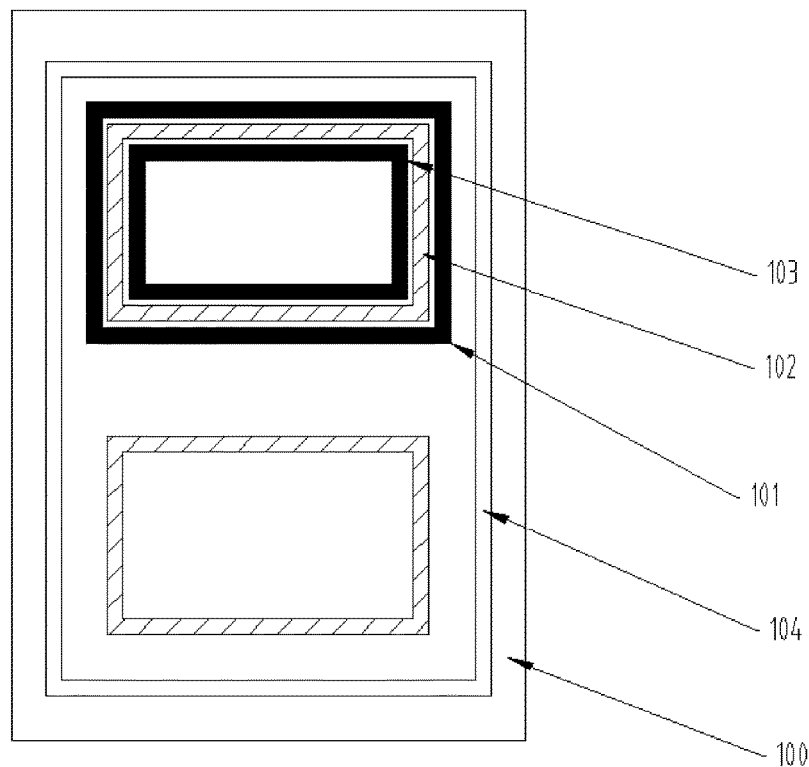
FIG. 1 is a schematic view of an encapsulation cover plate of an OLED display panel according to an embodiment of the present invention.

The structure and the technical means adopted by the present invention to achieve the above and other objects may be best understood by referring to the following detailed description of the preferred embodiments and the accompanying drawings. Furthermore, directional terms described by the present invention, such as upper, lower, front, back, left, right, inner, outer, side, longitudinal/vertical, transverse/horizontal, etc., are only directions by referring to the accompanying drawings, and thus the used directional terms are used to describe and understand the present invention, but the present invention is not limited thereto. In the drawings, structurally similar elements are given the same reference numerals.

The present invention is directed against a conventional manufacturing method of an OLED display panel, which solves the technological problem that exists in the conventional manufacturing method of an OLED display panel, whereby a portion of a laser beam wider than the frit may irradiate through a encapsulation cover plate and to an electrode of an OLED substrate during the glass frit encapsulating process, easily fusing the electrode on the substrate, so as to make OLED devices malfunction. Thereby the laser only irradiates on the glass frit. An embodiment according to the present invention can solve this drawback.

The present invention provides a manufacturing method of an organic light-emitting diode (OLED) display panel, comprising:

a step S1 of frosting a portion of an inner surface of an encapsulation cover plate corresponding to both sides of a glass frit to-be-disposed region;

a step S2 of disposing a light shielding film at the frosted treatment region of the inner surface of the encapsulation cover plate, wherein the light shielding film is a metal film having a light transmittance less than a first predetermined value or a non-metal film having a light transmittance less than a second predetermined value; and a step S3 of disposing a glass frit on the glass frit to-be-disposed region, thereby forming a frame-shape sealant.

As shown in FIG. 1, specifically, a schematic view of an encapsulation cover plate of an OLED display panel according to an embodiment of the present invention is illustrated. An encapsulation cover plate 100 is configured to attach on a surface of a side of an OLED substrate, and also configured to dispose a frame-shaped glass frit to-be-disposed region 102 for encapsulating OLED devices. The encapsulation cover plate 100 at least includes a glass frit to-be-disposed region 102, the encapsulation cover plate 100 further includes a frame-shaped UV glue to-be-applied region 104, and the frame-shaped UV glue to-be-applied region 104 is located near the periphery of the encapsulation cover plate 100. A UV glue is configured to attach the encapsulation cover plate 100 with the OLED substrate, temporarily fixes the encapsulation cover plate 100 with the OLED substrate, and temporarily isolates the OLED devices from contact with air in the outside environment so as to make a fake encapsulation. A portion of an inner surface of an encapsulation cover plate 100 corresponding to both sides of a glass frit to-be-disposed region 102 is frosted. The frosted treatment is applied to the encapsulation cover plate 100 by dry etching or other methods, thereby achieving coarsening the region of the inner surface of the encapsulation cover plate 100. A frosted treatment region includes a frame-shaped first frosted region 103 located inside the glass frit to-be-disposed region 102 and a frame-shaped second frosted region 101 located outside the glass frit to-be-disposed region 102, and the first frosted region 103 and the second frosted region 101 are closely adjacent to the glass frit to-be-disposed region 102 through a slit, respectively. Such that a laser applied in following process can be completely irradiated onto the glass frit through the slit, thereby completely curing the glass frit. A first width of the first frosted region 103 is equal to a second width of the second frosted region 101, and a third width of the slit disposed between the first frosted region and the glass frit to-be-disposed region is equal to a fourth width of the slit disposed between the second frosted region and the glass frit to-be-disposed region. A light shielding film is disposed at the frosted treatment region of the inner surface of the encapsulation cover plate 100, the light shielding film is a metal film having a light transmittance less than a first predetermined value or a non-metal film having a light transmittance less than a second predetermined value. The non-metal film is a high-temperature resistant film, the first predetermined value and the second predetermined value are determined to not cause adverse effects of the electrodes of the OLED devices. A first light shielding film is disposed on the first frosted region 103 and a second light shielding film is disposed on the second frosted region 101, and a glass frit is disposed on the glass frit to-be-disposed region 102, thereby forming a frame-shape sealant. On the OLED substrate, the OLED devices include electrode, the first light shielding film, the second light shielding film, and the glass frit covers the electrodes of the OLED devices.

The manufacturing method further comprises the following steps: after disposing the glass frit, curing the glass frit at a high temperature. A laser beam is generated with a laser head on a machine, so as to irradiate the glass frit, thereby curing the glass frit. A temperature of curing the glass frit through the laser beam is greater than 500° C. Since the light shielding films of the first frosted region and the second frosted region are disposed at the both sides of the glass frit, the light shielding film is a metal film having a light transmittance less than a first predetermined value or a non-metal film having a light transmittance less than a second predetermined value, the non-metal film is a high-temperature resistant film. Therefore, the first light shielding film and the second light shielding film are not damaged during curing the glass frit.

Under a nitrogen environment, a UV glue is applied around the glass frit disposed on the encapsulation cover plate. And under a nitrogen environment, the encapsulation cover plate is aligned and attached with the OLED substrate, and the UV glue is irradiated by a UV light, thereby curing the UV glue. The methods for disposing and curing the UV glue are the same as the disposing method and the curing method in the conventional art, and the details are not described herein again.

Figure 2:
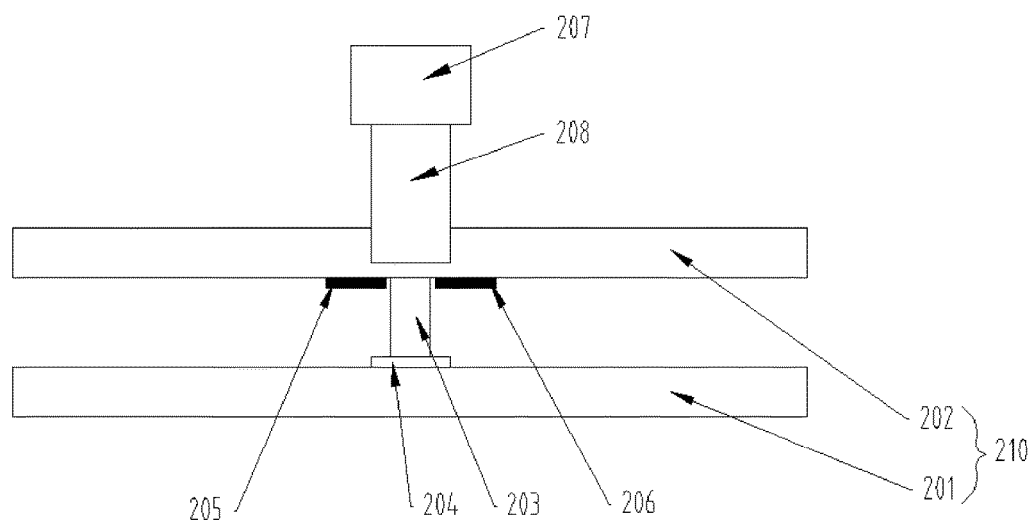
FIG. 2 is a schematic view of a laser scanning a glass frit to complete an OLED combined plate encapsulation according to the present invention.
Figure 3:
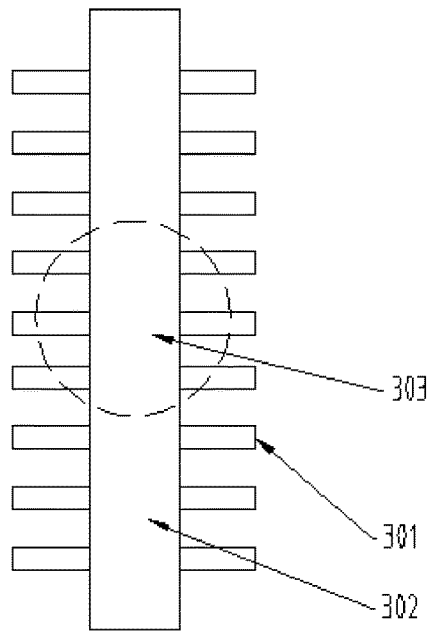
FIG. 3 is a schematic view of a laser scanning a glass frit to complete an OLED encapsulation according to the conventional art.
Figure 4:
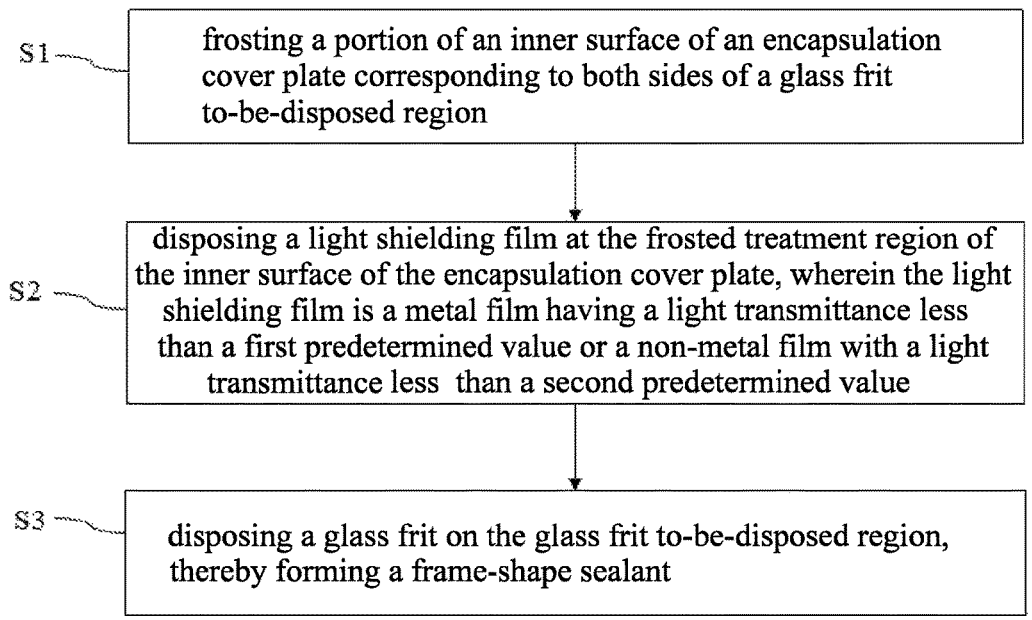
FIG. 4 is a flow chart of a manufacturing method of an OLED display panel according to the present invention.

The manufacturing method further includes the following steps: scanning the glass frit with a laser head at a side of the encapsulation cover plate of OLED combined plate under an atmospheric environment, melting the glass frit by a high temperature generated by the laser beam of the laser head, and then cooling and solidifying the glass frit. So that the encapsulation cover plate is attached on the OLED substrate. As shown in FIG. 2, a schematic view of a laser scanning a glass frit to complete an OLED combined plate encapsulation according to the present invention is illustrated. The OLED combined plate 210 includes an OLED substrate 201 and an encapsulation cover plate 202 is disposed oppositely. The OLED substrate 201 and the encapsulation cover plate 202 are attached via with a glass frit 203 and a UV glue. The attached OLED combined plate 210 is placed into an apparatus. The apparatus is provided with a laser head 207, the laser head 207 is configured to emit a laser beam 208. The laser head 207 irradiates a side of the encapsulation cover plate 202 of OLED combined plate 210. The laser head 207 is located directly above the encapsulation cover plate 202 at a position corresponding to the glass frit 203, so as to irradiate the glass frit 203. Such that the glass frit 203 melts under the irradiation of the laser beam 208 at a temperature more than 500° C., thereby the encapsulating cover plate 202 and the OLED substrate 201 are closely attached with each other.

On a portion of an inner surface of the encapsulation cover plate 202, a frame-shaped first frosted region 103 located inside a to-be-disposed region of the glass frit 203 and a frame-shaped first frosted region 101 located outside the to-be-disposed region of the glass frit 203. A first light shielding film 205 is disposed on the first frosted region and a second light shielding film 206 is disposed on the second frosted region. A first slit is disposed between the first light shielding film 205 and the glass frit 203 and a second slit is disposed between the second light shielding film 206 and the frit 203, and both widths of the first slit and the second slit are equal, so that the laser beam 208 can completely irradiate the glass paste 203 through the slits. The irradiation range of the laser beam 208 is located within a range covered with the first light shielding film 205, the second light shielding film 206, and the glass frit 203. OLED devices of the OLED substrate 201 includes electrodes 204, the electrodes 204 are located below the corresponding glass frit 203, and the first light shielding film 205, the second light shielding film 206, and the glass frit 203 cover the electrodes 204. During the irradiation of the laser beam 208, an excess laser light wider than a width of the glass frit 203 is effectively blocked by the first light shielding film 205 and the second light shielding film 206, so as to not irradiate onto the electrodes 204, and thereby not cause damage to the electrodes 204. Since regions where the encapsulation cover plate 202 is attached with the first light shielding film 205 and the second light shielding film 206 are subjected to a frosted treatment process, the frosted treatment regions may diffuse the laser light irradiated onto the first light shielding film 205 and the second light shielding film 206. Therefore the laser cannot be directly reflected to the laser head 207 so as to protect the laser head 207 from burn damage.

After the glass frit 203 melts, and then cooling and solidifying the glass frit 203, so that the encapsulation cover plate 202 is sealed with the OLED substrate 201, thereby achieve a real effective encapsulation.

The manufacturing method further includes the following steps: cutting along a cutting line on a periphery of the glass frit, and discarding an offcut with the UV glue, thereby obtaining a glass frit sealed OLED display panel.

In comparison with the conventional manufacturing method of an OLED display panel, the present invention provides a manufacturing method of an OLED display panel, an excess light of the laser beam can be blocked during the glass frit encapsulating process, thereby the laser only irradiates on the glass frit and will not require precise alignment process, thus protects electrodes on a OLED substrate. Moreover, both sides of the glass frit to-be-disposed region of the inner surface of the encapsulation cover plate have been finished by a frosting treatment, the shielded laser is not reflected to the apparatus, such as a laser head, thereby preventing the laser head to damage, and ensuring the effective of the encapsulation.

In view of the above, although the present invention has been disclosed by way of preferred embodiments, the above preferred embodiments are not intended to limit the present invention, and one of ordinary skill in the art, without departing from the spirit and scope of the invention, the scope of protection of the present invention is defined by the scope of the claims.

What is claimed is:

1. A manufacturing method of an organic light-emitting diode (OLED) display panel, comprising:
    a step S1 of frosting a portion of an inner surface of an encapsulation cover plate corresponding to both sides of a glass frit to-be-disposed region, wherein a frosted treatment region includes a frame-shaped first frosted region located inside the glass frit to-be-disposed region and a frame-shaped second frosted region located outside the glass frit to-be-disposed region, and each of the first frosted region and the second frosted region are closely adjacent to the glass frit to-be-disposed region through a slit;
    a step S2 of disposing a light shielding film at the frosted treatment region of the inner surface of the encapsulation cover plate, wherein the light shielding film is a metal film having a light transmittance less than a first predetermined value or a non-metal film having a light transmittance less than a second predetermined value; and
    a step S3 of disposing a glass frit on the glass frit to-be-disposed region, thereby forming a frame-shape sealant.

2. The manufacturing method of the OLED display panel according to claim 1, wherein a first width of the first frosted region is equal to a second width of the second frosted region, and a third width of the slit disposed between the first frosted region and the glass frit to-be-disposed region is equal to a fourth width of the slit disposed between the second frosted region and the glass frit to-be-disposed region.

3. The manufacturing method of the OLED display panel according to claim 2, wherein the light shielding film further comprises a first light shielding film disposed on the first frosted region and a second light shielding film disposed on the second frosted region, and wherein the OLED display panel further comprises an electrode of an OLED device covered by the glass frit.

4. The manufacturing method of the OLED display panel according to claim 1, further comprising steps of:
    after disposing the glass frit, curing the glass frit at a high temperature; and
    generating a laser beam with a laser head to irradiate and cure the glass frit, wherein a temperature of curing the glass frit through the laser beam is greater than 500° C.

5. The manufacturing method of the OLED display panel according to claim 4, wherein a region irradiated by the laser beam includes the first frosted region, the second frosted region and a region covered by the glass frit.

6. The manufacturing method of the OLED display panel according to claim 4, further comprising a step of:
    applying a UV glue around the glass frit disposed on the encapsulation cover plate under a nitrogen environment.

7. The manufacturing method of the OLED display panel according to claim 6, further comprising a step of:
    aligning and attaching the encapsulation cover plate with an OLED substrate, and irradiating the UV glue by a UV light under a nitrogen environment, thereby curing the UV glue.

8. The manufacturing method of the OLED display panel according to claim 7, further comprising steps of:
    scanning the glass frit with a laser head at a side of the encapsulation cover plate under an atmospheric environment; melting the glass frit by a high temperature generated by the laser beam of the laser head; and then cooling and solidifying the glass frit, so that the encapsulation cover plate is attached on the OLED substrate.

9. The manufacturing method of the OLED display panel according to claim 8, further comprising a step of:
    cutting along a cutting line on a periphery of the glass frit, and discarding an offcut with the UV glue, thereby obtaining a glass frit sealed OLED display panel.

10. A manufacturing method of an organic light-emitting diode (OLED) display panel, comprising:
a step S1 of frosting a portion of an inner surface of an encapsulation cover plate corresponding to both sides of a glass frit to-be-disposed region, so as to form a frosted treatment region;
a step S2 of disposing a light shielding film at the frosted treatment region of the inner surface of the encapsulation cover plate, wherein the light shielding film is a metal film having a light transmittance less than a first predetermined value or a non-metal film having a light transmittance less than a second predetermined value; and
a step S3 of disposing a glass frit on the glass frit to-be-disposed region, thereby forming a frame-shape sealant.

11. The manufacturing method of the OLED display panel according to claim 10, wherein a first width of a first frosted region is equal to a second width of a second frosted region and a third width of the slit disposed between the first frosted region and the glass frit to-be-disposed region is equal to a fourth width of the slit disposed between the second frosted region and the glass frit to-be-disposed region.

12. The manufacturing method of the OLED display panel according to claim 11, wherein the light shielding film further comprises a first light shielding film disposed on the first frosted region and a second light shielding film disposed on the second frosted region, and wherein the OLED display panel further comprises an electrode of an OLED device covered by the glass frit.

13. The manufacturing method of the OLED display panel according to claim 10, further comprising steps of:
after disposing the glass frit, curing the glass frit at a high temperature; and
generating a laser beam with a laser head to irradiate and cure the glass frit, wherein a temperature of curing the glass frit through the laser beam is greater than 500° C.

14. The manufacturing method of the OLED display panel according to claim 13, wherein a region irradiated by the laser beam includes a first frosted region, a second frosted region, and a region covered by the glass frit.

15. The manufacturing method of the OLED display panel according to claim 13, further comprising a step of:
applying a UV glue around the glass frit disposed on the encapsulation cover plate under a nitrogen environment.

16. The manufacturing method of the OLED display panel according to claim 15, further comprising a step of:
aligning and attaching the encapsulation cover plate with an OLED substrate, and irradiating the UV glue by a UV light under a nitrogen environment, thereby curing the UV glue.

17. The manufacturing method of the OLED display panel according to claim 16, further comprising steps of:
scanning the glass frit with a laser head at a side of the encapsulation cover plate under an atmospheric environment; melting the glass frit by a high temperature generated by the laser beam of the laser head; and then cooling and solidifying the glass frit, so that the encapsulation cover plate is attached on the OLED substrate.

18. The manufacturing method of the OLED display panel according to claim 17, further comprising a step of:
cutting along a cutting line on a periphery of the glass frit, and discarding an offcut with the UV glue, thereby obtaining a glass frit sealed OLED display panel.

* * * * *